(12) United States Patent
Lee et al.

(10) Patent No.: US 6,323,986 B1
(45) Date of Patent: Nov. 27, 2001

(54) RADIO FREQUENCY INPUT DEVICE OF SUPERSPEED OPTICAL COMMUNICATIONS MODULE

(75) Inventors: Sang-ho Lee, Suwon; Ji-chai Jeong, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/434,257

(22) Filed: Nov. 5, 1999

(30) Foreign Application Priority Data

Nov. 10, 1998 (KR) .................................................. 98-48005
Apr. 15, 1999 (KR) .................................................. 99-13326

(51) Int. Cl.$^7$ ....................................................... G02F 1/03
(52) U.S. Cl. ........................................... 359/248; 359/245
(58) Field of Search ..................................... 359/248, 249, 359/245, 246, 247, 254; 372/38; 385/8

(56) References Cited

U.S. PATENT DOCUMENTS 5,184,243 * 2/1993 Henmi et al. ......................... 359/181
5,371,755 * 12/1994 Murata et al. ......................... 372/38
5,548,607 * 8/1996 Tsang ..................................... 372/50
5,790,719 * 8/1998 Mitomi et al. .......................... 385/2

\* cited by examiner

*Primary Examiner*—Georgia Epps
*Assistant Examiner*—Gary O'Neill
(74) *Attorney, Agent, or Firm*—Burns, Doane, Swecker & Mathis, L.L.P

(57) ABSTRACT

A super radio frequency (RF) input device of a superspeed (2.5 Gbps or 10 Gbps) optical communications module, which controls the performance of the module, is provided. In the super RF input device of a super RF optical communications module, microstrip line patterns are formed in a certain size to have inductance and capacitance on a cross-shaped microstrip line, and an electroabsorption modulated laser and a thin film resistor or chip resistor are connected to each other by a bonding wire. Inductance generated here is appropriately controlled by using the length of the bonding wire, so that a 3 dB bandwidth is 13 GHz in a 10 Gbps module, and that an RF return loss increases from 4 dB in the existing module to 14 dB at 10 GHz.

10 Claims, 6 Drawing Sheets

RADIO FREQUENCY INPUT DEVICE OF SUPERSPEED OPTICAL COMMUNICATIONS MODULE

BACKGROUND OF THE INVENTION

1. Field of the Invention

The present invention relates to a radio frequency (RF) input device of a superspeed optical communications module which controls the performance of a module in the superspeed (2.5 Gbps, 10 Gbps) optical communications module.

2. Description of the Related Art

A 2.5/10 Gbps module, an essential component of superspeed optical communications, has drastically improved performance by changing the shape of a microstrip line used in the prior art, in order to improve characteristics such as 3 dB bandwidth and RF return loss, which are essential parameters of the module.

FIG. 1A is a plan configuration view of an RF input device of a conventional superspeed optical communications module. FIG. 1B is an equivalent circuit diagram of the RF input device of FIG. 1A. As shown in FIGS. 1A and 1B, an RF input device of a superspeed optical communications module includes a microstrip line pattern 5 of a constant width formed on a microwave substrate 6. An electroabsorption modulated laser (EML) chip 9 comprised of a laser diode 9a and a modulator 9b is mounted on a thin film resistor 8 and an EML submount 10. The microstrip line pattern 5 is connected to the thin film resistor 8 and the EML chip 9 by bonding wires 7. Here, the bonding wire is usually an Au wire having a thickness of 1 mm, and the length thereof is as short as possible to minimize a generated inductance component. A thin film or chip resistor 8 having a resistance of 45 to 55Ω is connected to the EML chip 9 to achieve impedance matching with the EML chip 9.

Reference numeral 1 in FIG. 1B denotes an inductance component due to a bonding wire used within a module, reference numeral 2 denotes a 2.5 Gbps or 10 Gbps EML, and reference numeral 3 denotes a thin film resistor or chip resistor having a resistance of 45 to 55Ω used to achieve impedance matching of a high speed module.

The microstrip line 5 is a metallic line formed so that the characteristic impedance simply matches with a resistance of 50Ω. The thus-formed microstrip line 5 cannot solve degradation of module characteristics caused by the bonding wire 7 and a capacitance component formed in the EML chip 9 and other parts, and has an 8 GHz 3 dB bandwidth (|S21|) and an RF return loss (|S11|) of about 11 dB as shown in FIG. 2, so that it becomes a problem in high-speed transmission. That is, the microstrip line 5 does not meet a current specification of 15 dB or more, so that there is a problem in its operation at 10 Gbps. Also, a great deal of heat is generated due to simultaneous consumption of direct current and alternating current power in a resistance of 45 to 55Ω.

SUMMARY OF THE INVENTION

To solve the above problems, it is an object of the present invention to provide a radio frequency (RF) input device of a super RF optical communications module whereby a 3 dB frequency bandwidth is improved and an RF return loss associated with impedance matching is improved, by changing the shape of a microstrip line which is an essential part.

Accordingly, to achieve the above object, the present invention provides a radio frequency (RF) input device of an optical communications module including: a microstrip line pattern comprised of an impedance matching area connected to an external circuit for achieving impedance matching, a capacitance area for generating a predetermined capacitance, and an inductance area for generating a predetermined inductance; an electroabsorption modulated laser connected to the inductance area in the microstrip line pattern; and a first thin film resistor for impedance matching connected between a connection point of the microstrip line pattern and the electroabsorption modulated laser and a ground point.

In the present invention, it is preferable that the resistance of the first resistor is 40 to 60Ω. Preferably, the RF input device of an optical communications module further includes a bonding wire having an inductance of less than 2 nH between the first resistor and a node at which the electroabsorption modulated laser and the microstrip line pattern are connected to each other. Also, it is preferable that the inductance area and the capacitance area are formed so that the inductance and capacitance are between 0.01 nH and 1 nH and between 0.01 pF and 0.2 pF, respectively, and then are controlled according to the characteristics of a connected electroabsorption modulated laser.

Also, it is preferable that the RF input device of an optical communications module further includes a second thin film resistor connected in series to the modulator to improve the performance of the optical communications module; a bonding wire having an inductance of less than 2 nH between the second thin film resistor and the electroabsorption modulated laser; and two capacitors of 200 pF and 0.1μF connected in parallel to each other between the first thin film resistor and the ground point.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENT

Figure 3A:
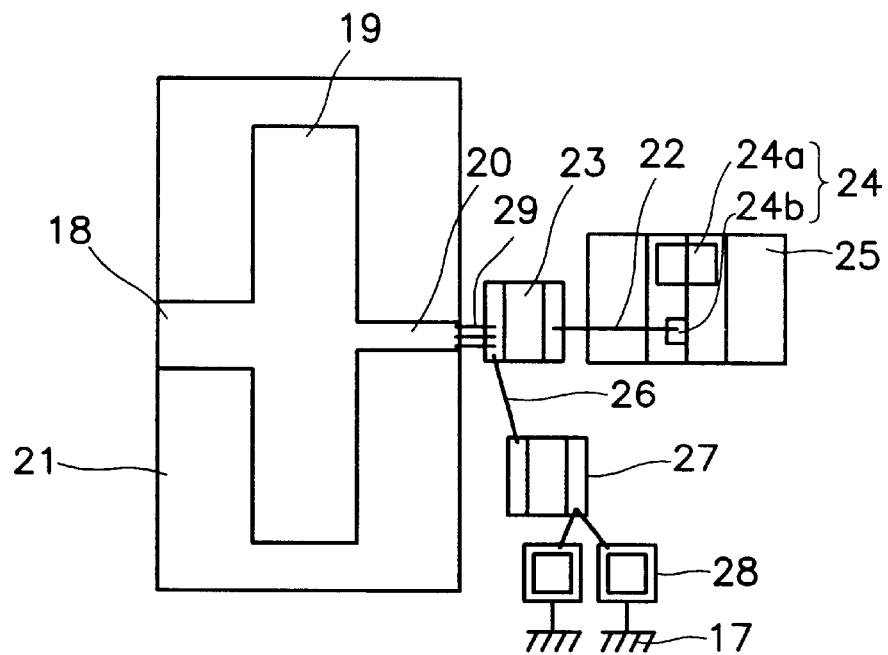
FIG. 3A is a plan configuration diagram of an RF input device of a superspeed optical communications module according to the present invention.
Figure 3B:
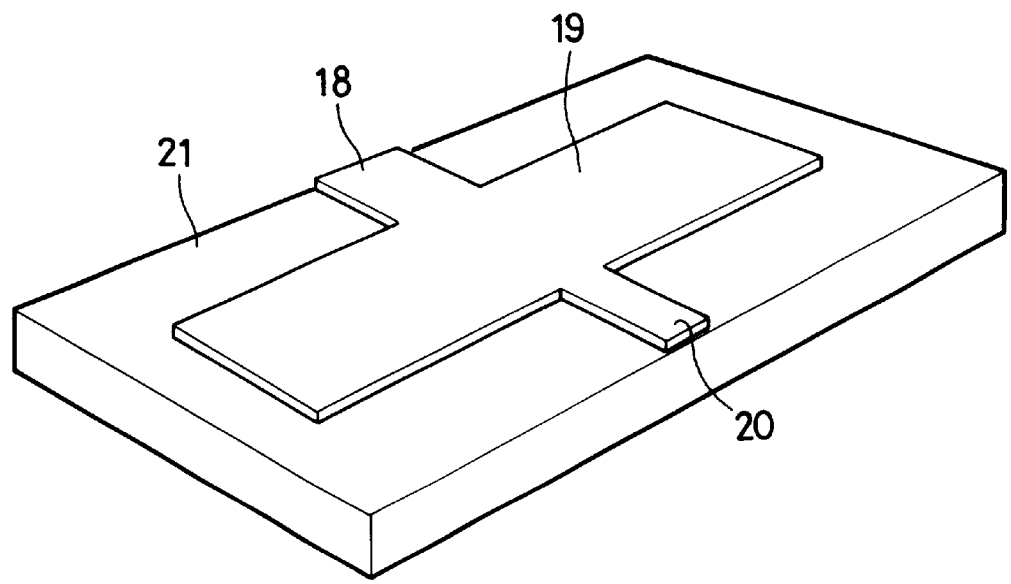
FIG. 3B is a perspective view of a microwave substrate in the RF input device of FIG. 3A.
Figure 3C:
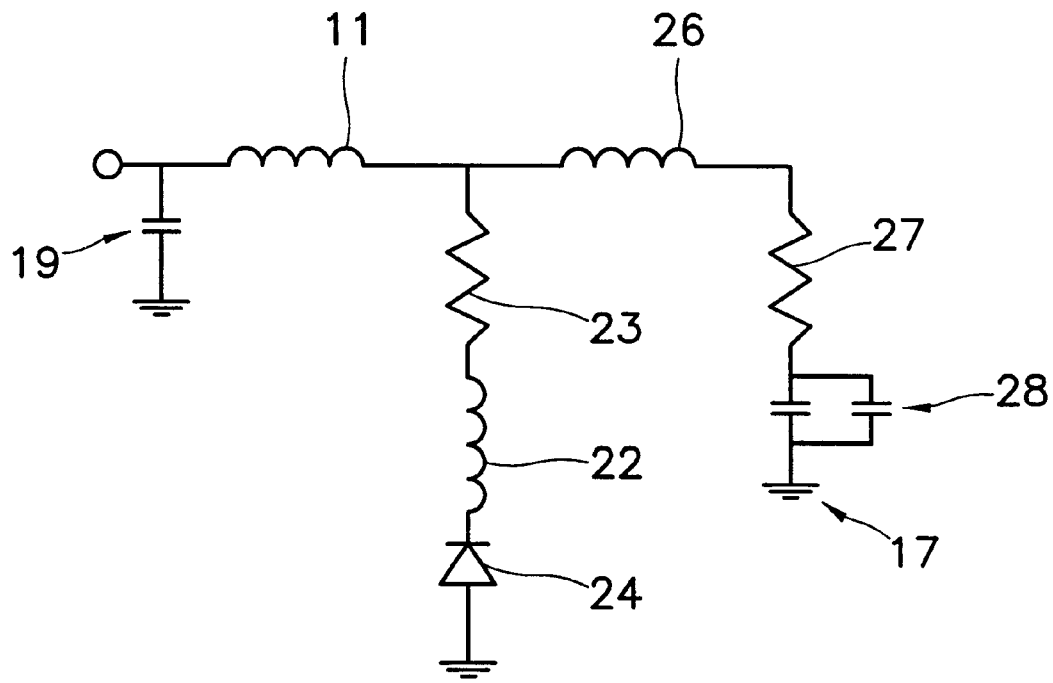
FIG. 3C is an equivalent circuit diagram of the RF input device of FIG. 3A.

Referring to FIGS. 3A, 3B and 3C, an RF input device of a superspeed optical communications module according to the present invention fundamentally includes microstrip line patterns 18, 19 and 20 formed on a microwave substrate 21, an electroabsorption modulated laser (EML) chip 24 which is mounted on an EML submount 25 and includes a laser diode 24a and a modulator 24b, and a first thin film resistor 27 for impedance matching. In particular, the microstrip line patterns 18, 19 and 20 are an impedance matching area 18 for achieving impedance matching with an external circuit, a capacitance area 19 for obtaining a predetermined capacitance value, and an inductance area 20 for obtaining a predetermined inductance value. The patterns of the capacitance area 19 and inductance area 20 are assembled, and then manufactured so that their widths and lengths are trimmed to give an appropriate capacitance value and an appropriate inductance value as shown in FIG. 3B. Here, the capacitance area 19 can be of any shape since its capacitance value is proportional to the area, but it is easy to shape the capacitance area 19 as a rectangle or a polygon in design. The RF input device of a superspeed optical communications module according to the present invention further includes a second thin film resistor (or a chip resistor) 23 installed in series between the microstrip line patterns 18, 19 and 20 and the EML chip 24 in order to improve the performance thereof, as shown in FIG. 3A. Also, two capacitors 28, one having a large capacitance and the other having a small capacitance, are installed between the first thin film resistor 27 and a ground point.

The inductance area 20 in the microstrip line pattern is connected to one terminal of the second thin film resistor 23 by a first bonding wire 29, and the other terminal of the second thin film resistor 23 is connected to the EML chip 24 by a second bonding wire 22. Also, the terminal of the second thin film resistor 23 is connected to one terminal of the first thin film resistor 27 by a third bonding wire 26. Here, the used bonding wire is usually an Au wire having a thickness of 1 mm, and is as short as possible to minimize a generated inductance component.

Referring to FIG. 3C, the second thin film resistor 23 has a resistance of about 3 to 15Ω, or it may not be necessary according to the characteristics of the connected EML chip 24 in some cases. That is, the second thin film resistor 23 is not required when the EML modulator 24b has a large internal serial resistance. Also, the first thin film resistor 27 is installed in the shape of a thin film on the LD submount 25 to achieve impedance matching of a 10 Gbps module, or is connected to a 2.5 Gbps or 10 Gbps EML modulator by the third bonding wire 26 as a chip resistor of 40 to 60Ω when the second thin film resistor 23 is not required. The inductance area (reference numeral 20 of FIG. 3A and reference numeral 11 of FIG. 3C) in the microstrip line pattern is formed to compensate for capacitance generated within the EML chip 24. The inductance area 20 in the microstrip line pattern is formed to have an inductance of 2 nH or less. The microstrip line patterns 18, 19 and 20 are made of duriod, aluminum or a material which is equivalent to aluminum and has good dielectric characteristics in a microwave band.

FIG. 3C is an equivalent circuit diagram of the RF input device of FIG. 3A. Reference numeral 11 denotes the sum of the inductance of the inductance area 20 in the microstrip line pattern and the inductance of each of the first bonding wires 29 in FIG. 3A. Reference numeral 19 denotes the capacitance of the capacitance area 19 in the microstrip line pattern in FIG. 3A, reference numeral 26 denotes the inductance of the third bonding wire 26 in FIG. 3A, reference numeral 23 denotes the second thin film resistor (or a chip resistor) 23 of FIG. 3A, and reference numeral 22 denotes the inductance of the second bonding wire 22 which connects the modulator 24a of FIG. 3A and the second thin film resistor (or a chip resistor) 23 with an appropriate length. This inductance is negligible, so can be omitted in an equivalent circuit.

In particular, the modulation characteristics of a 2.5 Gbps or 10 Gbps optical communications module depend on the mixed inductance 11 of each of the first bonding wires 29 and the inductance area 20 of the microstrip line pattern and the serial resistance value of the modulator 24b. The second thin film resistor (chip resistor) 23 can be used by being connected to the modulator 24b in series in order to improve the return loss. However, the second thin film resistor 23 can be omitted when the modulator 24b in the EML has a large internal serial resistance, as described above.

Figure 4:
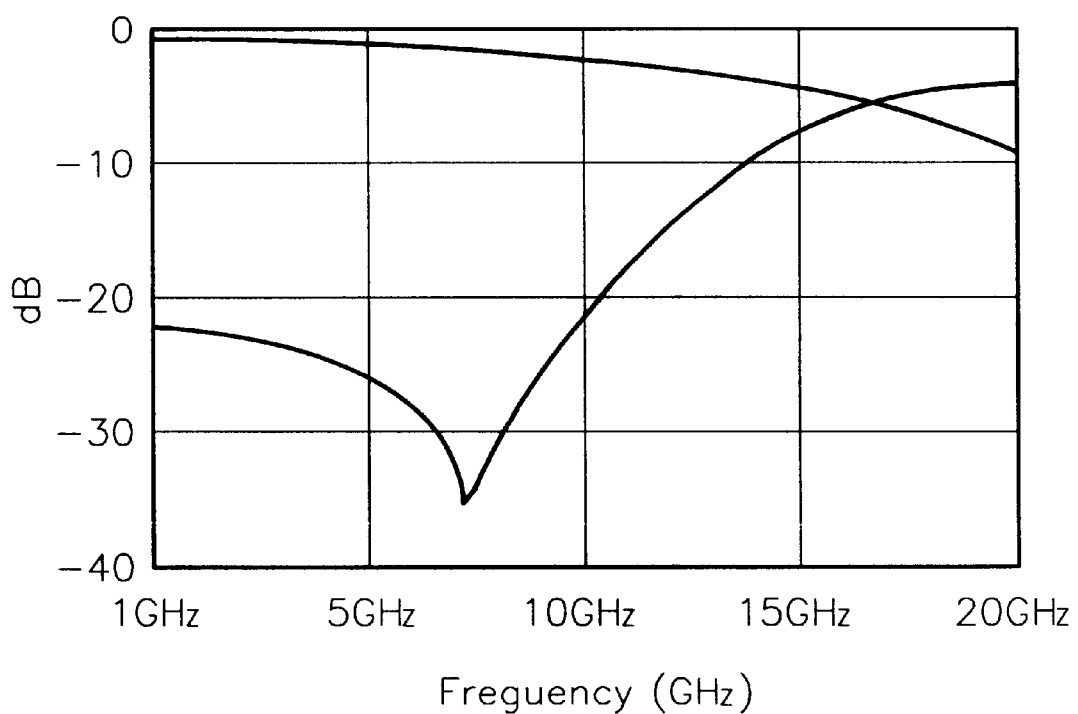
FIG. 4 is a graph showing the response characteristics of the RF input device of FIG. 3A.

The RF input device having such a configuration, for improving the performance of a high-speed optical communications module of 2.5 Gbps or more, improves the 3 dB frequency bandwidth by 60% or more compared to a module adopting an existing microstrip line or a coplanar waveguide, by changing the shape of the microstrip line patterns 18, 19 and 20 which are essential parts. The RF input device also improves the RF return loss associated with impedance matching, from 6 dB (within 8 Ghz) of an existing 10 Gbps EML module, to 16 dB. That is, the inductance component 11 formed in the microstrip line patterns 18, 19 and 20, which are not used in an existing module, increases the 3 dB bandwidth to 13 GHz as shown in FIG. 4 by offsetting the internal capacitance of the EML chip 24 during the operation of the 2.5 Gbps or 10 Gbps EML module. Also, a capacitance 19 of about 0.2 pF or less is formed on a strip line on the same plane as the inductance component 11. The inductance component 11 improves the electrical return loss from 6 dB in an existing module to 16 dB within 8 GHz by changing the position of a resonance peak as described in FIG. 4 by connecting the second thin film resistor 23 thereto in series.

Figure 1A:
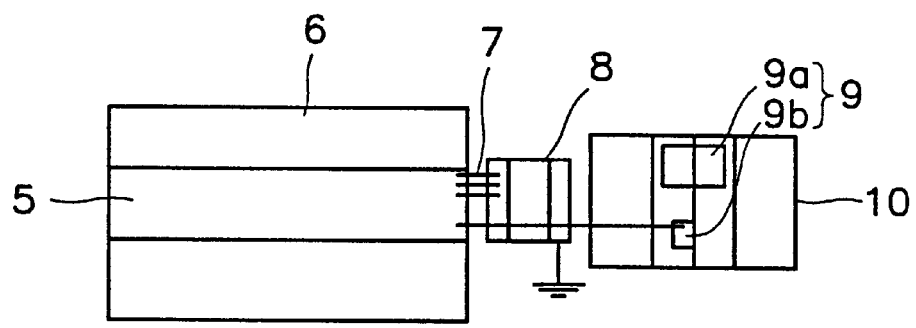
FIG. 1A is a plan configuration view of an RF input device of a conventional superspeed optical communications module.
Figure 1B:
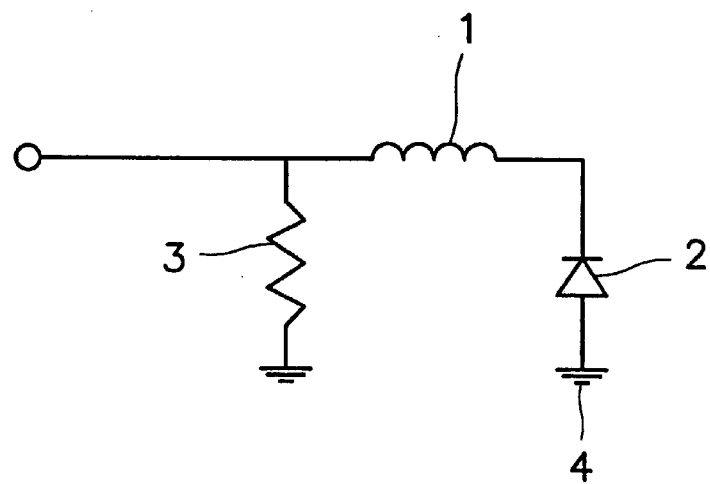
FIG. 1B is an equivalent circuit diagram of the RF input device of FIG. 1A.
Figure 2:
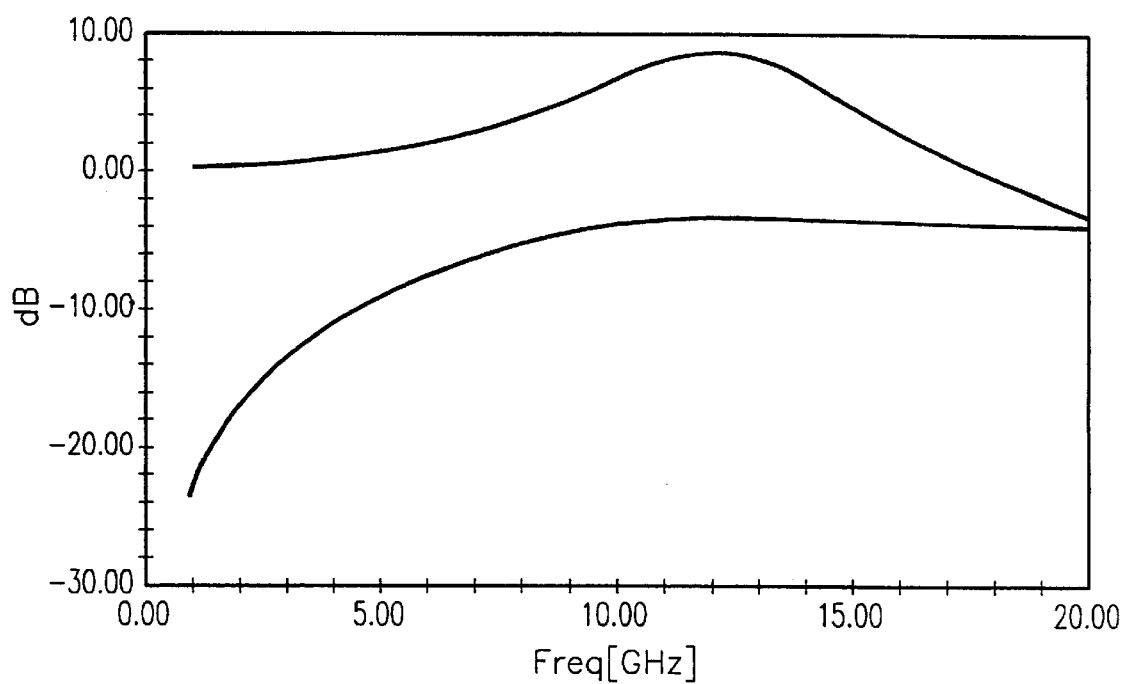
FIG. 2 is a graph showing the response characteristics of the RF input device of FIG. 1A.
Figure 5A:
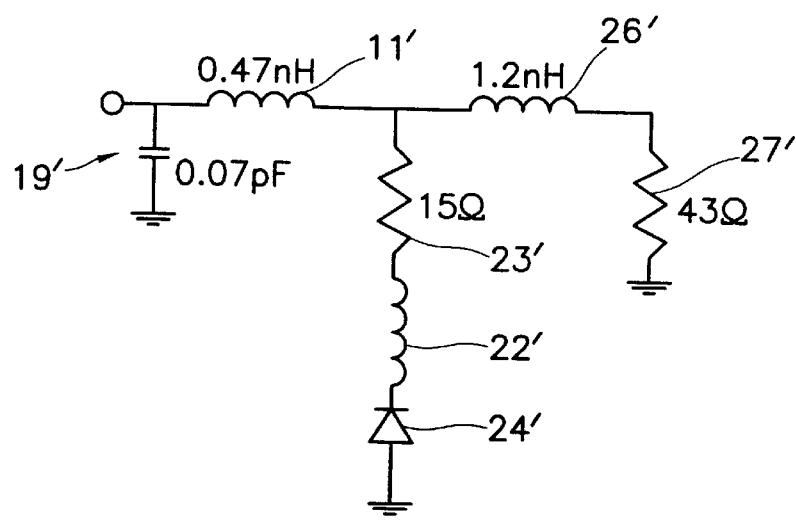
FIG. 5A is a circuit diagram of an embodiment of an RF input device of a super RF optical communications module according to the present invention.
Figure 5B:
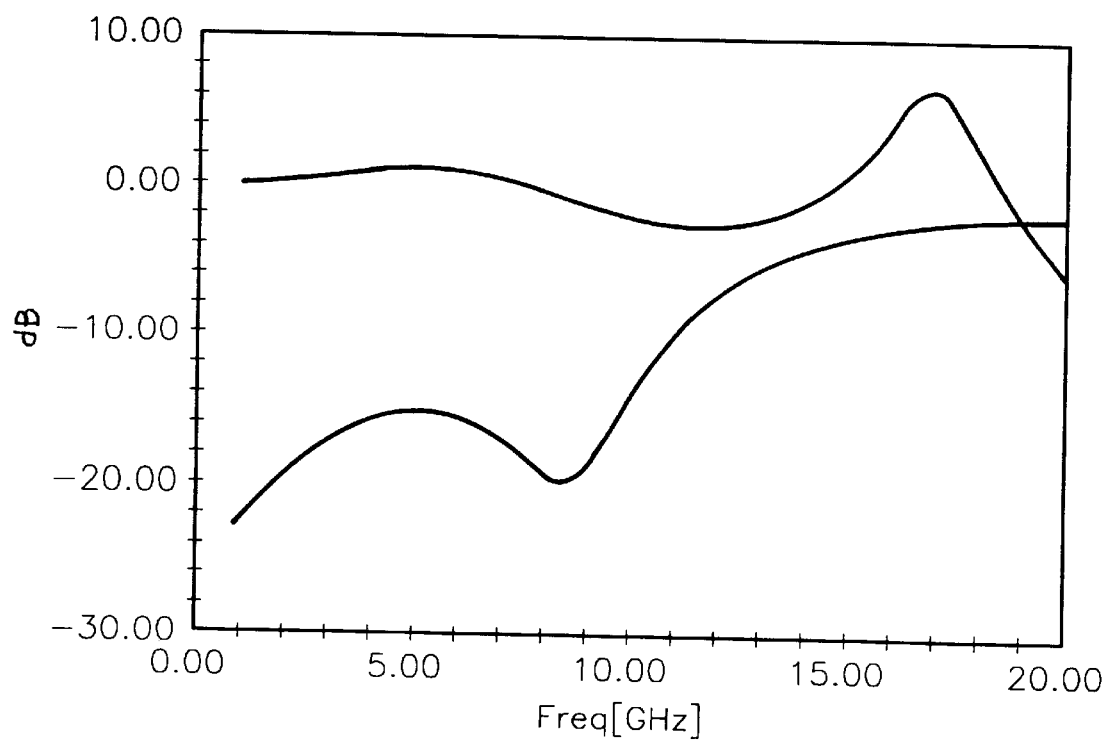
FIG. 5B is a graph showing the response characteristics due to the embodiment of FIG. 5A.

Meanwhile, as shown in FIG. 5A, the microstrip line patterns 18, 19 and 20 of FIG. 3A are formed in a cross shape of a certain size as shown in FIG. 3A to have an inductance 11' and a capacitance 19'. The inductance 26' of the third bonding wire 26 which is about 1.2 nH, connects the EML 24 to the first thin film resistor (or a chip resistor) 27 of 40 to 60Ω, and inductance generated at this time is appropriately controlled using the length of the third bonding wire 26, thereby obtaining the results as shown in FIG. 5B. In FIG. 5B, the 3 dB bandwidth is 13 GHz, and the RF return loss obtains 14 dB at 10 GHz from 4 dB in a conventional 10 Gbps module and thus shows excellent results compared to the conventional 4 dB (see FIG. 2).

As described above, in the RF input device of a super RF optical communications module according to the present invention, microstrip line patterns are formed in a certain size to have inductance and capacitance on a cross-shaped microstrip line, and an EML and a thin film resistor or chip resistor are connected to each other by a bonding wire. Thus, the 3 dB bandwidth is 13 GHz, and the RF return loss increases from 4 dB in the prior art to 14 dB at 10 GHz, which represents excellent results compared to those in a conventional 10 Gbps module. To be more specific, the present invention has the following effects.

First, an inductance component formed in the microstrip line removes a capacitance component within the EML chip, so that the 3 dB bandwidth is broadened by 60% or more. Thus, the transmission characteristics at 7 to 8 GHz in the existing 10 Gbps EML module can be drastically improved.

Second, the position of a resonance peak is moved by capacitance of less than 0.2 pF formed on the microstrip line and other components, so that the RF return loss in the existing 10 Gbps EML module is improved from 6 dB to 16 dB for frequencies up to 8 GHz.

Third, consumption of DC current is reduced by using capacitors having capacitances of 200 pF and 0.1 pF, so that reliability of the module is improved, and that the entire consumed power of the system is reduced.

What is claimed is:

1. A radio frequency (RF) input device of an optical communications module comprising:

a microstrip line pattern comprised of an impedance matching area connected to an external circuit for achieving impedance matching, a capacitance area for generating a predetermined capacitance, and an inductance area for generating a predetermined inductance;

an electroabsorption modulated laser connected to the inductance area in the microstrip line pattern; and a first thin film resistor for impedance matching connected between a connection point of the microstrip line pattern and the electroabsorption modulated laser and a ground point.

2. The device of claim 1, wherein the resistance of the first resistor is 40 to 60Ω.

3. The device of claim 1, further comprising a bonding wire having an inductance of less than 2 nH between the first resistor and a node at which the electroabsoprtion modulated laser and the microstrip line pattern are connected to each other.

4. The device of claim 3, wherein the inductance area and the capacitance area are formed so that the inductance and capacitance are between 0.01 nH and 1 nH and between 0.01 pF and 0.2 pF, respectively, and then are controlled according to the characteristics of a connected electroabsoprtion modulated laser.

5. The device of claim 1, further comprising a second thin film resistor connected in series to the modulator to improve the performance of the optical communications module.

6. The device of claim 5, further comprising a bonding wire having an inductance of less than 2 nH between the second thin film resistor and the electroabsoprtion modulated laser.

7. The device of claim 6, further comprising two capacitors of 200 pF and 0.1 μF connected in parallel to each other between the first thin film resistor and the ground point.

8. The device of claim 2, further comprising a second thin film resistor connected in series to the modulator to improve the performance of the optical communications module.

9. The device of claim 3, further comprising a second thin film resistor connected in series to the modulator to improve the performance of the optical communications module.

10. The device of claim 4, further comprising a second thin film resistor connected in series to the modulator to improve the performance of the optical communications module.

* * * * *